US011075096B2

(12) United States Patent
Inada et al.

(10) Patent No.: US 11,075,096 B2
(45) Date of Patent: Jul. 27, 2021

(54) SUBSTRATE PROCESSING APPARATUS

(71) Applicant: Tokyo Electron Limited, Tokyo (JP)

(72) Inventors: Takao Inada, Kumamoto (JP);
Hironobu Hyakutake, Kumamoto (JP);
Hisashi Kawano, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/675,551

(22) Filed: Nov. 6, 2019

(65) Prior Publication Data

US 2020/0152489 A1 May 14, 2020

(30) Foreign Application Priority Data

Nov. 9, 2018 (JP) .............................. JP2018-211537

(51) Int. Cl.
*H01L 21/67* (2006.01)
*H01L 21/677* (2006.01)
*H01L 21/311* (2006.01)

(52) U.S. Cl.
CPC .. *H01L 21/67086* (2013.01); *H01L 21/31105* (2013.01); *H01L 21/67248* (2013.01); *H01L 21/67781* (2013.01)

(58) Field of Classification Search
None
See application file for complete search history.

(56) References Cited

U.S. PATENT DOCUMENTS

| 6,848,457 | B2 * | 2/2005 | Marumo | C25D 21/18 |
| | | | | 134/98.1 |
| 7,169,253 | B2 * | 1/2007 | Chen | G03F 7/423 |
| | | | | 156/345.11 |
| 8,043,466 | B1 * | 10/2011 | Shin | C03C 15/00 |
| | | | | 156/345.13 |
| 2005/0274696 | A1 * | 12/2005 | Huang | H01L 21/67253 |
| | | | | 216/84 |
| 2006/0151112 | A1 * | 7/2006 | Yoshida | B08B 3/02 |
| | | | | 156/345.15 |
| 2008/0023444 | A1 * | 1/2008 | Osawa | H01L 21/67086 |
| | | | | 216/83 |
| 2015/0093906 | A1 * | 4/2015 | Kobayashi | H01L 21/31111 |
| | | | | 438/748 |
| 2019/0148183 | A1 * | 5/2019 | Inada | H01L 21/67248 |
| | | | | 438/745 |
| 2020/0152489 | A1 * | 5/2020 | Inada | H01L 21/67253 |

FOREIGN PATENT DOCUMENTS

JP        2013-232593  A     11/2013

* cited by examiner

*Primary Examiner* — Sylvia MacArthur
(74) *Attorney, Agent, or Firm* — Abelman, Frayne & Schwab

(57) ABSTRACT

A substrate processing method includes etching a substrate on which a silicon oxide film and a silicon nitride film are formed with a phosphoric acid processing liquid. In the etching, a silicon concentration in the phosphoric acid processing liquid is a first silicon concentration at which the silicon oxide film is etched, from a start time until a first time interval has elapsed.

6 Claims, 13 Drawing Sheets

SUBSTRATE PROCESSING APPARATUS

CROSS-REFERENCE TO RELATED APPLICATIONS

This application is based on and claims priority from Japanese Patent Application No. 2018-211537 filed on Nov. 9, 2018 with the Japan Patent Office, the disclosure of which is incorporated herein in its entirety by reference.

TECHNICAL FIELD

The present disclosure relates to a substrate processing method, a substrate processing apparatus, and a storage medium.

BACKGROUND

In the related art, a substrate processing apparatus is known which performs an etching processing, in which, among a silicon nitride film (SiN) and a silicon oxide film ($SiO_2$) laminated on a substrate, the silicon nitride film is selectively etched, by immersing the substrate in a phosphoric acid processing liquid (see, e.g., Japanese Patent Laid-Open Publication No. 2013-232593).

SUMMARY

A substrate processing method according to one aspect of the present disclosure includes an etching process in which a substrate having thereon a laminated film of a silicon oxide film and a silicon nitride film is etched with a phosphoric acid processing liquid. In the etching process, a silicon concentration in the phosphoric acid processing liquid is set to a first silicon concentration at which the silicon oxide film is etched, from a start time until a first time interval elapses.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, an embodiment of a substrate processing method, a substrate processing apparatus, and a storage medium disclosed in the present disclosure will be described with reference to the accompanying drawings. The present disclosure is not limited to the following exemplary embodiments. Further, the drawings are schematic, and the relationship between dimensions of each element, the ratio of each element, or the like may differ from the actual situation. Portions having different dimensional relationships and ratios from each other may be included between drawings.

In the related art, a substrate processing apparatus is known which performs an etching processing, in which, among a silicon nitride film (SiN) and a silicon oxide ($SiO_2$) laminated on a substrate, the silicon nitride film is selectively etched, by immersing the substrate in a phosphoric acid processing liquid.

However, when the silicon nitride film is selectively etched in the substrate on which a plurality of silicon nitride films and silicon oxide films are laminated (hereinafter, also referred to as "highly laminated"), the path which discharge the etched silicon nitride film components to the outside of the substrate becomes long. As a result, the silicon concentration in the phosphoric acid processing liquid which enters to the gap formed between the silicon oxide films increases, and thus, silicon oxide may be extracted on the silicon oxide film.

Therefore, it is expected to etch a silicon nitride film with a good accuracy even in a case of a substrate on which a silicon nitride film and a silicon oxide film are highly laminated.

<Configuration of Substrate Processing Apparatus>

Figure 1:
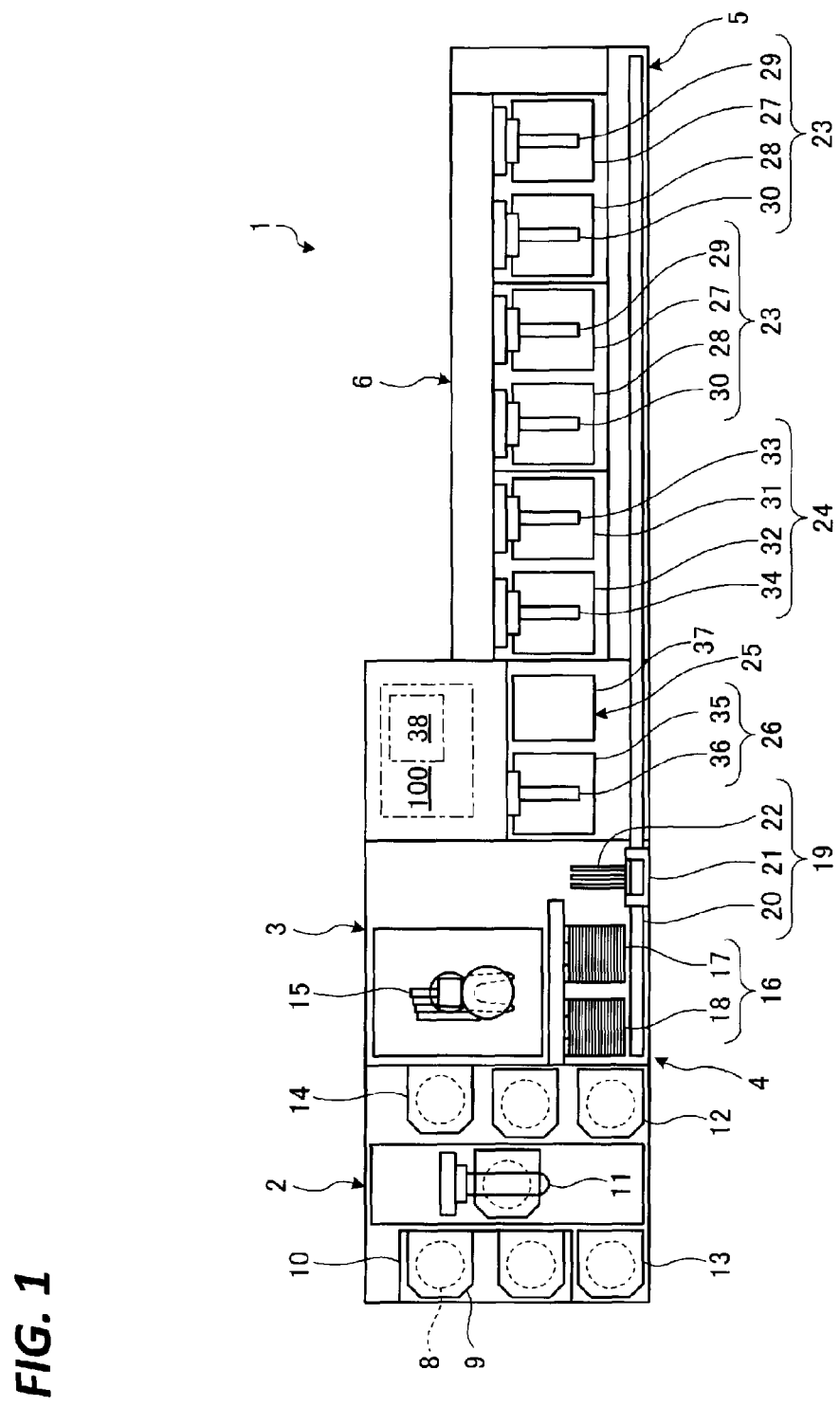
FIG. 1 is a schematic plan view of a substrate processing apparatus according to an embodiment.

First, descriptions will be made on a configuration of a substrate processing apparatus 1 according to an embodiment with reference to FIG. 1. FIG. 1 is a schematic plan view of the substrate processing apparatus 1. In the following, in order to clarify positional relationships, the X-axis, the Y-axis, and the Z-axis which are orthogonal to each other will be defined. The positive Z-axis direction will be regarded as a vertically upward direction.

As illustrated in FIG. 1, the substrate processing apparatus 1 includes a carrier carrying-in/out section 2, a lot forming section 3, a lot placing section 4, a lot transfer section 5, a lot processing section 6, and a controller 100.

The carrier carrying-in/out section 2 performs carry-in and carry-out of a carrier 9 that accommodates a plurality of (e.g., 25) substrates (silicon wafers) 8 vertically arranged in a horizontal posture.

The carrier carrying-in/out section 2 includes a carrier stage 10 on which a plurality of carriers 9 are placed, a carrier transfer mechanism 11 that transfers the carriers 9, carrier stocks 12, 13 that temporarily store the carriers 9, and a carrier placing table 14 on which the carriers 9 are placed.

The carrier carrying-in/out section 2 transfers the carrier 9 carried into the carrier stage 10 from the outside to the carrier stock 12 or the carrier placing table 14 by using the carrier transfer mechanism 11. That is, the carrier carrying-in/out section 2 transfers the carrier 9 that accommodates the plurality of substrates 8 before being processed by the lot processing section 6 to the carrier stock 12 or the carrier placing table 14.

The carrier stock 12 temporarily stores the carrier 9 that accommodates the plurality of substrates 8 before being processed by the lot processing section 6.

The plurality of substrates 8 are carried-out by a substrate transfer mechanism 15 described later from the carrier 9 that is transferred to the carrier placing table 14, and accommodates the plurality of substrates 8 before being processed by the lot processing section 6. Further, the plurality of substrates 8 after being processed by the lot processing section 6 are carried-in from the substrate transfer mechanism 15 to the carrier 9 that is placed on the carrier placing table 14, and does not accommodate the substrate 8.

The carrier carrying-in/out section 2 transfers the carrier 9 that is placed on the carrier placing table 14, and accommodates the plurality of substrates 8 after being processed by the lot processing section 6 to a carrier stock 13 or the carrier stage 10 by using the carrier transfer mechanism 11.

The carrier stock 13 temporarily stores the plurality of substrates 8 after being processed by the lot processing section 6. The carrier 9 transferred to the carrier stage 10 is carried out to the outside.

The lot forming section 3 includes the substrate transfer mechanism 15 that transfers a plurality (e.g., 25) of substrates 8. The lot forming section 3 forms a lot constituted by a plurality (e.g., 50) of substrates 8 by transferring the plurality (e.g., 25) of substrates 8 twice by the substrate transfer mechanism 15.

The lot forming section 3 forms a lot by transferring the plurality of substrates 8 from the carrier 9 placed on the carrier placing table 14 to the lot placing section 4, by using the substrate transfer mechanism 15, to place the plurality of substrates 8 in the lot placing section 4.

The plurality of substrates 8 that form a lot are simultaneously processed by the lot processing section 6. Upon forming a lot, the lot may be formed such that pattern-formed planes on the surfaces of the plurality of substrates 8 face each other, or such that all the pattern-formed planes on the surfaces of the plurality of substrates 8 are directed to one side.

Further, the lot forming section 3 transfers the plurality of substrates 8 by using the substrate transfer mechanism 15, from the lot processed by the lot processing section 6, and placed in the lot placing section 4, to the carrier 9.

The substrate transfer mechanism 15 has two types of substrate supports as a substrate support configured to support the plurality of substrates 8, that is, a pre-processing substrate support (not illustrated) that supports the plurality of substrates 8 before being processed, and a post-processing substrate support (not illustrated) that supports the plurality of substrates 8 after being processed. Therefore, for example, particles attached to the plurality of substrates 8 before being processed are suppressed from being transferred and attached to the plurality of substrates 8 after being processed.

The substrate transfer mechanism 15 changes the posture of the plurality of substrates 8 from the horizontal posture to the vertical posture and vice versa during the transfer of the plurality of substrates 8.

The lot placing section 4 temporarily places (waits) the lot transferred between the lot forming section 3 and the lot processing section 6 on a lot placing table 16 by the lot transfer section 5. The lot placing section 4 includes a carry-in-side lot placing table 17 and a carry-out-side placing table 18.

The lot before being processed is placed on the carry-in-side lot placing table 17. The lot after being processed is placed on the carry-out-side lot placing table 18. On each of the carry-in-side lot placing table 17 and the carry-out-side lot placing table 18, a plurality of substrates 8 for one lot are placed back and forth in the vertical posture.

The lot transfer section 5 transfers the lot between the lot placing section 4 and the lot processing section 6, or inside the lot processing section 6. The lot transfer section 5 includes a lot transfer mechanism 19 that transfers the lot.

The lot transfer mechanism 19 includes a rail 20 disposed along the lot placing section 4 and the lot processing section 6, and a moving body 21 movable on the rail 20 while holding the lot. In the moving body 21, a substrate holder 22 is provided to hold the lot formed by the plurality of substrates 8 arranged back and forth in the vertical posture. The lot transfer mechanism 19 constitutes a transfer section.

The lot transfer section 5 receives the lot placed on the carry-in-side lot placing table 17 by the substrate holder 22 of the lot transfer mechanism 19, and delivers the received lot to the lot processing section 6. Further, the lot transfer section 5 receives the lot processed in the lot processing section 6 by the substrate holder 22 of the lot transfer mechanism 19, and delivers the received lot to the carry-out-side lot placing table 18. Further, the lot transfer section 5 transfers the lot inside the lot processing section 6 by using the lot transfer mechanism 19.

The lot processing section 6 performs a processing such as, for example, etching, cleaning, or drying on the lot formed by the plurality of substrates 8 arranged back and forth in the vertical posture. The lot processing section 6 includes two etching processing devices 23, a cleaning processing device 24, a substrate holder cleaning processing device 25, and a drying processing device 26.

The etching processing device 23 performs an etching processing on the lot. The cleaning processing device 24 performs a cleaning processing on the lot. The substrate holder cleaning processing device 25 performs a cleaning processing on the substrate holder 22. The drying processing device 26 performs a drying processing on the lot. The number of the etching processing device 23 is not limited to two, and may be one, or three or more.

The etching processing device 23 includes an etching processing bath 27, a rinse processing bath 28, and substrate elevating mechanisms 29 and 30. Although not illustrated in FIG. 1, the etching processing device 23 of the embodiment includes a plurality of etching processing baths 27.

An etching processing liquid (hereinafter, referred to as an "etching liquid") is stored in the etching processing bath 27. A rinse processing liquid (e.g., deionized water) is stored in the rinse processing bath 28. The details of the etching processing bath 27 will be described later. In the elevating mechanisms 29 and 30, the plurality of substrates 8 that form the lot are held to be arranged back and forth in the vertical posture.

The etching processing device 23 receives the lot from the substrate holder 22 of the lot transfer mechanism 19 by the substrate elevating mechanism 29, and lowers the received lot by the substrate elevating mechanism 29 to immerse the lot in the etching processing liquid in the processing bath 27, thereby performing an etching processing. The etching processing is performed for, for example, one hour to three hours.

Further, in the embodiment, etching processing under different conditions may be continuously performed by transferring the lot from one etching processing bath 27 of the etching processing device 23 to another etching processing bath 27.

Then, the etching processing device 23 raises the substrate elevating mechanism 29 to take out the lot from the processing bath 27, and delivers the lot from the substrate elevating mechanism 29 to the substrate holder 22 of the lot transfer mechanism 19.

Further, a rinse processing is performed by receiving the lot from the substrate holder 22 of the lot transfer mechanism 19 by the substrate elevating mechanism 30, and lowering the received lot by the substrate elevating mechanism 30 to immerse the lot in the rinse processing liquid in the processing bath 28.

Then, the etching processing device 23 raises the substrate elevating mechanism 30 to take out the lot from the processing bath 28, and delivers the lot from the substrate elevating mechanism 30 to the substrate holder 22 of the lot transfer mechanism 19.

The cleaning processing device 24 includes a cleaning processing bath 31, a rinse processing bath 32, and substrate elevating mechanisms 33 and 34. A cleaning processing liquid (e.g., SC-1 (mixed liquid of ammonia, hydrogen peroxide, and water)) is stored in the cleaning processing bath 31. A rinse processing liquid (e.g., deionized water) is stored in the rinse processing bath 32. In the elevating mechanisms 33 and 34, the plurality of substrates 8 for one lot are held to be arranged back and forth in the vertical posture.

The drying processing device 26 includes a cleaning processing bath 35, and a substrate elevating mechanism 36 that elevates with respect to the processing bath 35. A drying processing gas (e.g., isopropyl alcohol (IPA)) is supplied into the processing bath 35. In the elevating mechanism 36, the plurality of substrates 8 for one lot are held to be arranged back and forth in the vertical posture.

The drying processing device 26 receives the lot from the substrate holder 22 of the lot transfer mechanism 19 by the substrate elevating mechanism 36, and lowers the received lot by the substrate elevating mechanism 36 to carry-in to the processing bath 35, thereby performing a dry processing with the drying processing gas supplied into the processing bath 35. Then, the drying processing device 26 raises the lot by the substrate elevating mechanism 36 to deliver the lot on which the drying processing is performed from the substrate elevating mechanism 36 to the substrate holder 22 of the lot transfer mechanism 19.

The substrate holder cleaning processing device 25 includes a processing bath 37, and is able to supply a cleaning processing liquid and a drying gas into the processing bath 37. Accordingly, the substrate holder cleaning processing device 25 supplies the cleaning processing liquid and then supplies the drying gas onto the substrate holder 22 of the lot transfer mechanism 19, thereby performing the cleaning processing on the substrate holder 22.

The controller 100 controls the operations of the respective parts of the substrate processing apparatus 1 (including the carrier carrying-in/out section 2, the lot forming section 3, the lot placing section 4, the lot transfer section 5, and the lot processing section 6). The controller 100 controls each part of the substrate processing apparatus 1, based on signals from a switch or the like.

The controller 100 is constituted by, for example, a computer, and includes a computer-readable storage medium 38. The storage medium 38 stores a program that controls various processings performed in the substrate processing apparatus 1.

The controller 100 controls the operations of the substrate processing apparatus 1 by reading and executing the program stored in the storage medium 38. Further, the program may be stored in the computer-readable storage medium 38 or may be installed from another storage medium to the storage medium 38 of the controller 100.

The computer-readable recording medium 38 may be, for example, a hard disk (HD), a flexible disk (FD), a compact disk (CD), a magnet optical disk (MO), or a memory card.

<Configuration of Etching Processing Bath>

Figure 2:
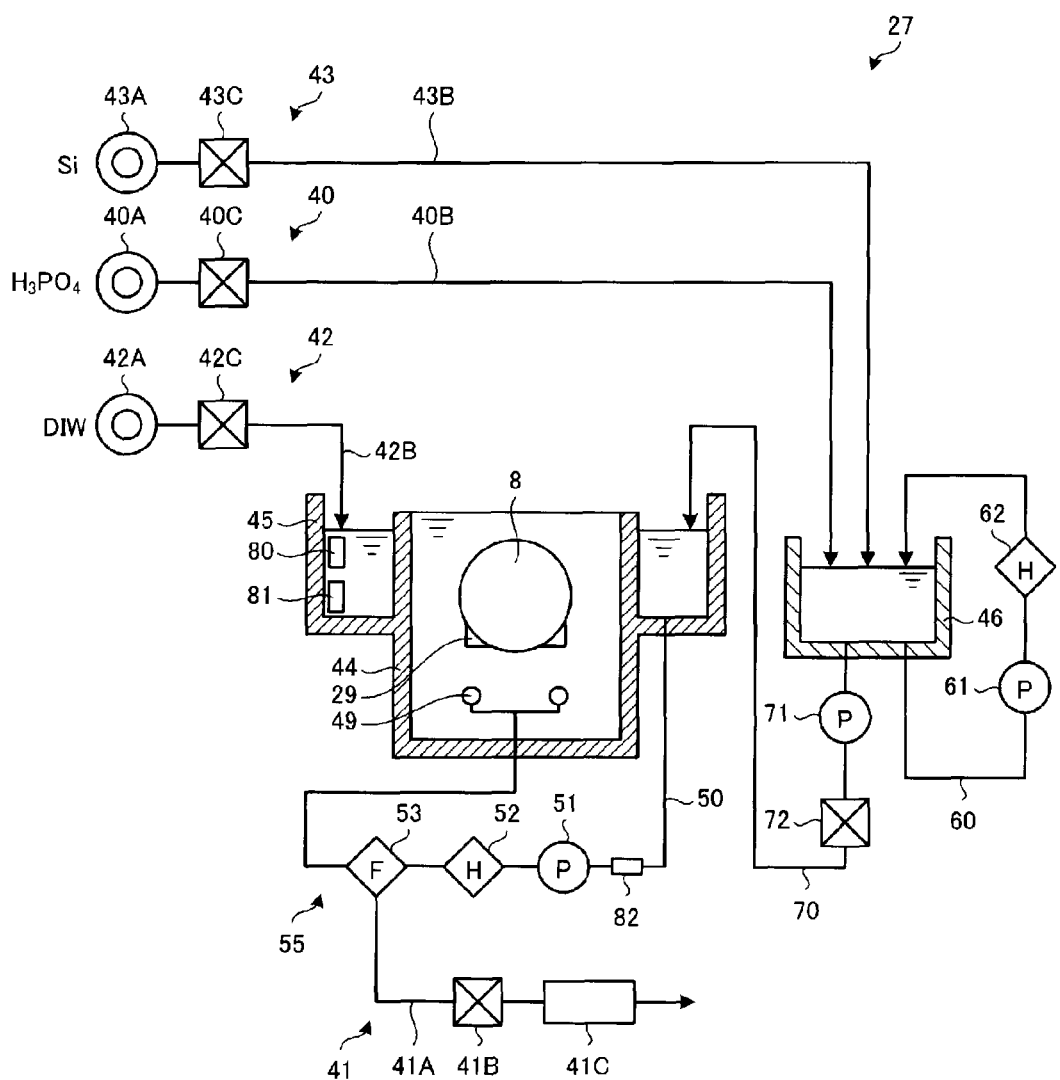
FIG. 2 is a schematic block diagram illustrating a configuration of an etching processing bath according to the embodiment.

Next, descriptions will be made on the etching processing bath 27 with reference to FIG. 2. FIG. 2 is a schematic block diagram illustrating a configuration of the etching processing bath 27 according to the embodiment.

In the etching processing bath 27, among a silicon nitride film (SiN) 8A (see FIG. 3A) and a silicon oxide film ($SiO_2$) 8B (see FIG. 3A) formed on the substrate 8, the silicon nitride film 8A is selectively etched, by using the etching liquid.

In the etching processing of the nitride film, a solution in which a silicon (Si)-containing compound is added to a phosphoric acid ($H_3PO_4$) liquid solution to regulate the silicon concentration is generally used as the etching liquid.

As a method for regulating the silicon concentration, there is a method in which a dummy substrate is immersed in an existing phosphoric acid liquid solution to dissolve silicon (seasoning), or a method in which a silicon-containing compound such as colloidal silica is dissolved in a phosphoric acid liquid solution. Further, there is another method in which a silicon-containing compound liquid solution is added to a phosphoric acid liquid solution to regulate the silicon concentration.

The etching processing bath 27 includes a phosphoric acid liquid solution supply 40, a phosphoric acid liquid solution discharger 41, a deionized water supply 42, a silicon supply 43, an inner bath 44, an outer bath 45, and a temperature adjusting tank 46.

The phosphoric acid liquid solution supply 40 includes a phosphoric acid liquid solution supply source 40A, a phosphoric acid liquid solution supply line 40B, and a first flow rate regulator 40C.

The phosphoric acid liquid solution supply source 40A is a tank which stores a phosphoric acid liquid solution. The phosphoric acid liquid solution supply line 40B connects the phosphoric acid liquid solution supply source 40A and the temperature adjusting tank 46, so as to supply the phosphoric acid liquid solution from the phosphoric acid liquid solution supply source 40A to the temperature adjusting tank 46.

The first flow rate regulator 40C is provided in the phosphoric acid liquid solution supply line 40B to regulate the supply amount of the phosphoric acid liquid solution supplied to the temperature adjusting tank 46. The first flow rate regulator 40C is constituted by, for example, an opening/closing valve, a flow rate control valve, or a flow meter.

The deionized water supply 42 includes a deionized water supply source 42A, a deionized water supply line 42B, and a second flow rate regulator 42C. The deionized water supply 42 supplies deionized water DIW to the outer bath 45 to replenish water evaporated by heating the etching liquid.

The deionized water supply line 42B connects the deionized water supply source 42A and the outer bath 45, so as to supply the deionized water having a predetermined temperature from the deionized water supply source 42A to the outer bath 45.

The second flow rate regulator 42C is provided in the deionized water supply line 42B to regulate the supply amount of the deionized water supplied to the outer bath 45. The second flow rate regulator 42C is constituted by, for example, an opening/closing valve, a flow rate control valve, or a flow meter. The temperature of the etching liquid, the phosphoric acid concentration, and the silicon concentration are regulated by regulating the supply amount of the deionized water by the second flow rate regulator 42C. The second flow rate regulator 42C constitutes a temperature adjuster, a phosphoric acid concentration regulator, and a silicon concentration regulator.

The silicon supply 43 includes a silicon supply source 43A, a silicon supply line 43B, and a third flow rate regulator 43C.

The silicon supply source 43A is a tank which stores a silicon-containing compound liquid solution. The silicon supply line 43B connects the silicon supply source 43A and the temperature adjusting tank 46, so as to supply the silicon-containing compound liquid solution from the silicon supply source 43A to the temperature adjusting tank 46.

The third flow rate regulator 43C is provided in the silicon supply line 43B to regulate the supply amount of the silicon-containing compound liquid solution supplied to the temperature adjusting tank 46. The third flow rate regulator 43C is constituted by, for example, an opening/closing valve, a flow rate control valve, or a flow meter.

The silicon-containing compound liquid solution is supplied when the etching processing is ended, and a preliminary liquid supplied when the etching liquid is completely replaced is generated. The silicon supply 43 may be able to supply the silicon-containing compound liquid solution to the outer bath 45. In this case, the silicon supply 43 may supply the silicon-containing compound liquid solution to the outer bath 45 when the silicon concentration in the etching liquid is decreased during the etching processing.

The inner bath 44 is opened at the upper portion, and the etching liquid is supplied to the vicinity of the upper portion. In the inner bath 44, the lot (the plurality of substrates 8) is immersed in the etching liquid by the substrate elevating mechanism 29 to perform the etching processing on the substrates 8. The inner bath 44 constitutes a substrate processing bath.

The outer bath 45 is provided around the upper portion of the inner bath 44 and the upper portion thereof is opened. The etching liquid overflowed from the inner bath 44 flows into the outer bath 45. Further, a preliminary liquid is supplied from the temperature adjusting tank 46 to the outer bath 45. Further, the deionized water is supplied from the deionized water supply 42 to the outer bath 45.

The outer bath 45 includes a temperature sensor 80 configured to detect the temperature of the etching liquid and a phosphoric acid concentration sensor 81 configured to detect the phosphoric acid concentration of the etching liquid. Signals generated by each of the sensors 80 and 81 are input to the controller 100 (see FIG. 1).

The outer bath 45 and the inner bath 44 are connected with each other by a first circulation line 50. One end of the first circulation line 50 is connected to the outer bath 45, and the other end of the first circulation line 50 is connected to a processing liquid supply nozzle 49 provided in the inner bath 44.

The first circulation line 50 is provided with a first pump 51, a first heater 52, and a filter 53 in order from the outer bath 45. The etching liquid in the outer bath 45 is heated by the first heater 52 and flows into the inner bath 44 from the processing liquid supply nozzle 49.

The first heater 52 regulates the temperature of the etching liquid supplied to the inner bath 44. Further, the first circulation line 50 includes a silicon concentration sensor 82 configured to detect the silicon concentration in the etching liquid. A signal generated by the silicon concentration sensor 82 is input to the controller 100. The first heater 52 constitutes a temperature adjuster.

The etching liquid is sent from the outer bath 45 through the first circulation line 50 to the inner bath 44 by driving the first pump 51. Further, the etching liquid flows out to the outer bath 45 again by being overflowed from the inner bath 44.

In this way, a circulation path 55 for the etching liquid is formed. That is, the circulation path 55 is formed by the outer bath 45, the first circulation line 50, and the inner bath 44. In the circulation path 55, the outer bath 45 is provided upstream of the first heater 52 with the inner bath 44 as a reference.

The phosphoric acid liquid solution supplied from the phosphoric acid liquid solution supply 40 is stored as a preliminary liquid in the temperature adjusting tank 46. Further, in the temperature adjusting tank 46, a preliminary liquid in which the phosphoric acid liquid solution supplied from the phosphoric acid liquid solution supply 40 and the silicon-containing compound liquid solution supplied from the silicon supply 43 are mixed is generated and stored.

For example, in the temperature adjusting tank 46, a preliminary liquid in which the phosphoric acid liquid solution and the silicon-containing compound liquid solution are mixed is generated and stored, when the etching liquid in the inner bath 44 and the outer bath 45 is totally replaced. Further, in the temperature adjusting tank 46, the phosphoric acid liquid solution is stored as the preliminary liquid, when the etching liquid is partly replaced during the etching processing.

A second circulation line 60 which circulates the preliminary liquid in the temperature adjusting tank 46 is connected to the temperature adjusting tank 46. Further, one end of a supply line 70 is connected to the temperature adjusting tank 46. The other end of the supply line 70 is connected to the outer bath 45.

The second circulation line 60 includes a second pump 61 and a second heater 62. The preliminary liquid in the temperature adjusting tank 46 is heated and circulated by driving the second pump 61 while the second heater 62 is turned ON. The second heater 62 regulates the temperature of the preliminary liquid. The second heater 62 constitutes a temperature adjuster.

The supply line 70 includes a third pump 71 and a fourth flow rate regulator 72. The fourth flow rate regulator 72 regulates the supply amount of the preliminary liquid supplied to the outer bath 45. The fourth flow rate regulator 72 is constituted by, for example, an opening/closing valve, a flow rate control valve, or a flow meter. The temperature of the etching liquid, the phosphoric acid concentration, and the silicon concentration are regulated by regulating the supply amount of the preliminary liquid by the fourth flow rate regulator 72. The fourth flow rate regulator 72 constitutes a temperature adjuster, a phosphoric acid concentration regulator, and a silicon concentration regulator.

The preliminary liquid stored in the temperature adjusting tank 46 is supplied to the outer bath 45 through the supply line 70, when the etching liquid is completely or partly replaced.

The phosphoric acid liquid solution discharger 41 discharges the etching liquid when replacing all or a part of the etching liquid used in the etching processing. The phosphoric acid liquid solution discharge 41 includes a discharge line 41A, a fifth flow rate regulator 41B, and a cooling tank 41C.

The discharge line 41A is connected to the first circulation line 50. The fifth flow rate regulator 41B is provided in the discharge line 41A and regulates the discharge amount of the discharged etching liquid. The fifth flow rate regulator 41B is constituted by, for example, an opening/closing valve, a flow rate control valve, or a flow meter.

The cooling tank 41C temporarily stores and cools the etching liquid flowing out through the discharge line 41A. The discharge amount is regulated by the fifth flow rate regulator 41B, and, for example, temperature of the etching liquid, the phosphoric acid concentration, and the silicon concentration are regulated by being supplied with the deionized water. The fifth flow rate regulator 41B constitutes a temperature adjuster, a phosphoric acid concentration regulator, and a silicon concentration regulator.

The opening/closing of the opening/closing valve or the degree of the flow rate control valve which constitutes the first flow rate regulator 40C to the fifth flow rate regulator 41B is changed by an actuator (not illustrated) operating based on the signals from the controller 100. That is, the opening/closing valve or the flow rate control valve which constitutes the first flow rate regulator 40C to the fifth flow rate regulator 41B is controlled by the controller 100.

<Outline of Etching Processing>

Figure 3A:
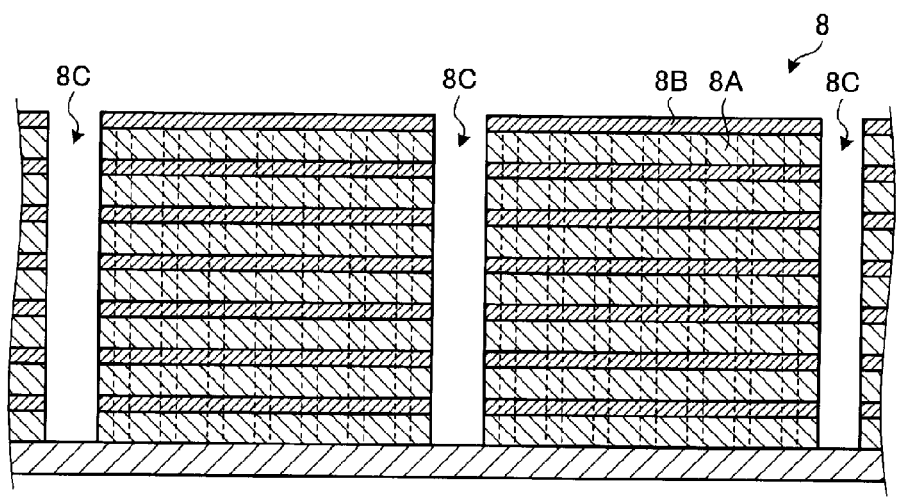
FIG. 3A is a schematic view illustrating a cross-section of a substrate before performing an etching processing.
Figure 3B:
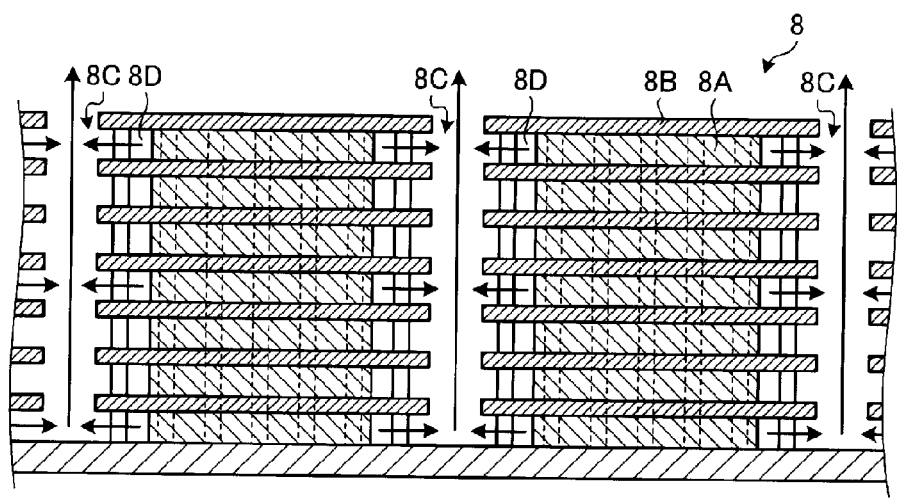
FIG. 3B is a schematic view illustrating a state of the substrate on which the etching processing is proceeded.
Figure 3C:
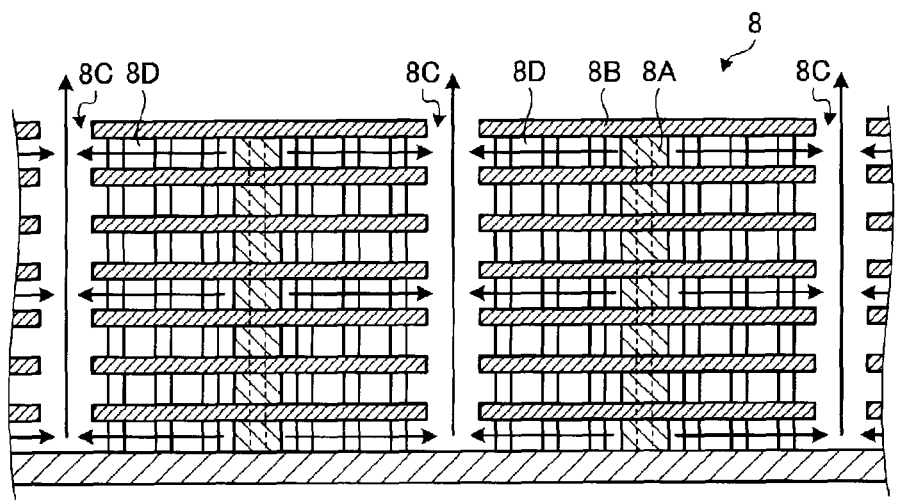
FIG. 3C is a schematic view illustrating a state of the substrate on which the etching processing is further proceeded.
Figure 3D:
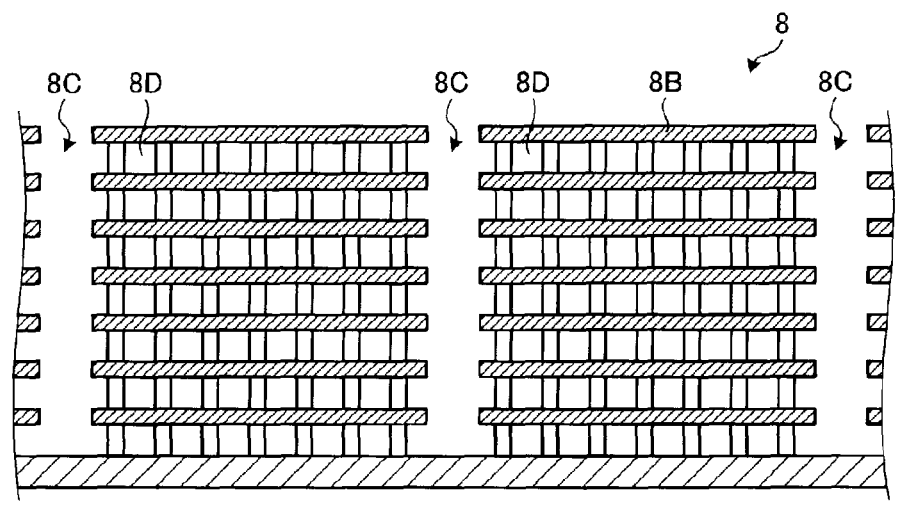
FIG. 3D is a schematic view illustrating a state of the substrate on which the etching processing is ended.

Next, descriptions will be made on the etching processing according to the embodiment with reference to FIGS. 3A to 3D. FIG. 3A is a schematic view illustrating a cross-section of the substrate 8 before performing the etching processing. FIG. 3B is a schematic view illustrating a state of the substrate 8 on which the etching processing is proceeded. FIG. 3C is a schematic view illustrating a state of the substrate 8 on which the etching processing is further proceeded. FIG. 3D is a schematic view illustrating a state of the substrate 8 on which the etching processing is ended.

As illustrated in FIG. 3A, a plurality of silicon nitride films 8A and silicon oxide films 8B are alternately laminated on the substrate 8 before performing the etching processing. Further, a plurality of grooves 8C configured to allow the etching liquid to enter and to etch the laminated silicon nitride films 8A are formed on the substrate 8.

When the substrate 8 is immersed in the inner bath 44 to start the etching processing, as illustrated in FIG. 3B, first, the silicon nitride film 8A in the vicinity of a groove 8C is etched. That is, in the etching processing, the silicon nitride film 8A close to the groove 8C is sequentially etched.

The components of the silicon nitride film 8A eluted into the etching liquid by the etching is discharged from a gap 8D formed by etching the silicon nitride film 8A to the groove 8C, and discharged from the groove 8C to the outside of the substrate 8. The etching liquid in the groove 8C or the gap 8D is substituted by new etching liquid to proceed the etching.

As a result, as the etching processing is proceeded, as illustrated in FIG. 3C, the distance from the portion to be etched to the groove 8C is increased. That is, the distance at which the component of the silicon nitride film 8A eluted to the etching liquid is discharged to the outside of the substrate 8 is increased.

As a result, when the etching rate of the silicon nitride film 8A is large, the silicon concentration contained in the etching liquid in the groove 8C or the gap 8D becomes high. Particularly, the silicon concentration in the etching liquid becomes high in the gap 8D formed at an inner side of the groove 8C, that is, at a portion where the distance from the surface of the substrate 8 is long.

Therefore, the silicon oxide may be extracted on the silicon oxide film 8B, while the etching liquid containing the component of the silicon nitride film 8A etched and eluted is discharged to the outside of the substrate 8. As illustrated in FIG. 3D, when the etching processing is further proceeded, the gaps 8D at both sides are communicated with each other.

<Details of Etching Processing>

Figure 4:
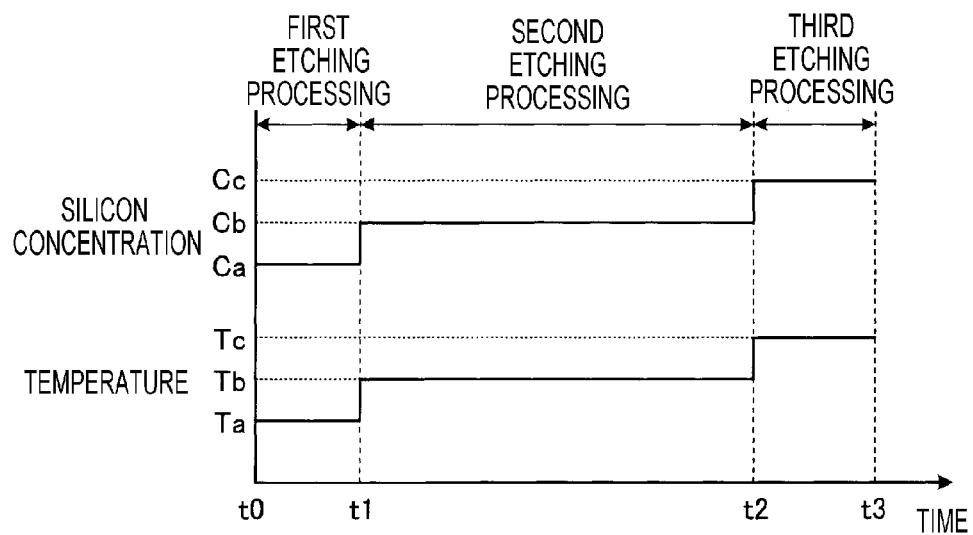
FIG. 4 is a view illustrating transitions of a silicon concentration in an etching liquid and a temperature of the etching liquid in the etching processing according to the embodiment.

Next, descriptions will be made on the details of the etching processing according to the embodiment with reference to FIGS. 4, 5, 6, and 7A to 7C. FIG. 4 is a view illustrating transitions of the silicon concentration in the etching liquid and the temperature of the etching liquid in the etching processing according to the embodiment.

As illustrated in FIG. 4, the etching processing according to the embodiment includes a first etching processing, a second etching processing, and a third etching processing.

The first etching processing is performed at a first time interval from a time t0 at which the etching processing is started to a predetermined time t1. The second etching processing is performed at a second time interval from the time t1 to a predetermined time t2, following the first etching processing. The third etching processing is performed at a third time interval from the time t2 to a predetermined time t3 at which the etching processing is ended, following the second etching processing.

In the first etching processing, the silicon concentration in the etching liquid is a predetermined first concentration Ca, and the temperature of the etching liquid is a predetermined first temperature Ta. Further, in the second etching processing, the silicon concentration in the etching liquid is a predetermined second concentration Cb higher than the first concentration Ca, and the temperature of the etching liquid is a predetermined second temperature Tb higher than the first temperature Ta.

Further, in the third etching processing, the silicon concentration in the etching liquid is a predetermined third concentration Cc higher than the second concentration Cb, and the temperature of the etching liquid is a predetermined third temperature Tc higher than the second temperature Tb.

Figure 5:
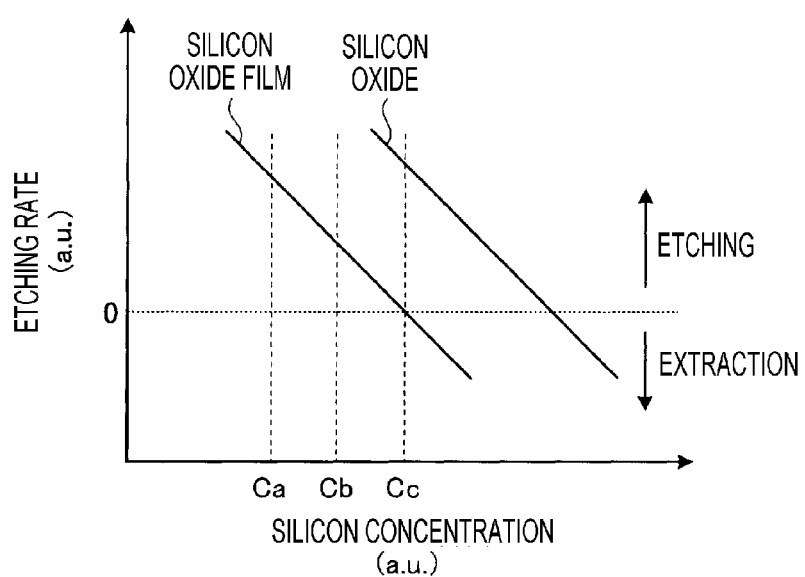
FIG. 5 is a view illustrating an example of a relationship between the silicon concentration in the etching liquid and an etching rate in the etching processing of a silicon oxide film and a silicon oxide.

Here, descriptions will be made on the details of such first concentration Ca to third concentration Cc with reference to FIG. 5. FIG. 5 is a view illustrating an example of a relationship between the silicon concentration in the etching liquid and the etching rate in the etching processing of the silicon oxide film 8B and the silicon oxide.

As illustrated in FIG. 5, even in the silicon oxide film 8B and the silicon oxide composed of the same $SiO_2$, the etching rates are different because the film quality is different. Further, in both the silicon oxide film 8B and the silicon oxide, the etching rates are decreased as the silicon concentration in the etching liquid is increased, and at the silicon concentration higher than a predetermined threshold value, the silicon oxide is extracted instead of being dissolved by etching.

As illustrated in FIG. 5, the first concentration Ca is a concentration at which not only the silicon oxide, but also the silicon oxide film 8B is etched. Further, the third concentration Cc is a concentration at which the silicon oxide film 8B is not etched (i.e., the etching rate is substantially zero), but the silicon oxide is etched.

Then, the second concentration Cb is a concentration between the first concentration Ca and the third concentration Cc. That is, the second concentration Cb is a concentration at which not only the silicon oxide, but also the silicon oxide film 8B is etched, while the etching rate itself is lower than that of the first concentration Ca.

Here, the higher the silicon concentration in the etching liquid (e.g., the second concentration Cb or the third concentration Cc), the larger the etching rate of the silicon nitride film 8A with respect to the silicon oxide film 8B (i.e., the selection rate increases).

Meanwhile, when the substrate 8 on which the silicon nitride film 8A and the silicon oxide film 8B are highly laminated is processed with an etching liquid having a high silicon concentration, it has been concerned that silicon oxide is extracted on the silicon oxide film 8B, particularly positioned below the lower side of the groove 8C.

This is because it is difficult to be substituted with new etching liquid at the lower side of the groove 8C compared to the upper side of the groove 8C, and thus, the silicon concentration is inevitably increased. Therefore, the inventors of the present disclosure earnestly studied the details of this phenomenon and obtained new knowledge.

Figure 6:
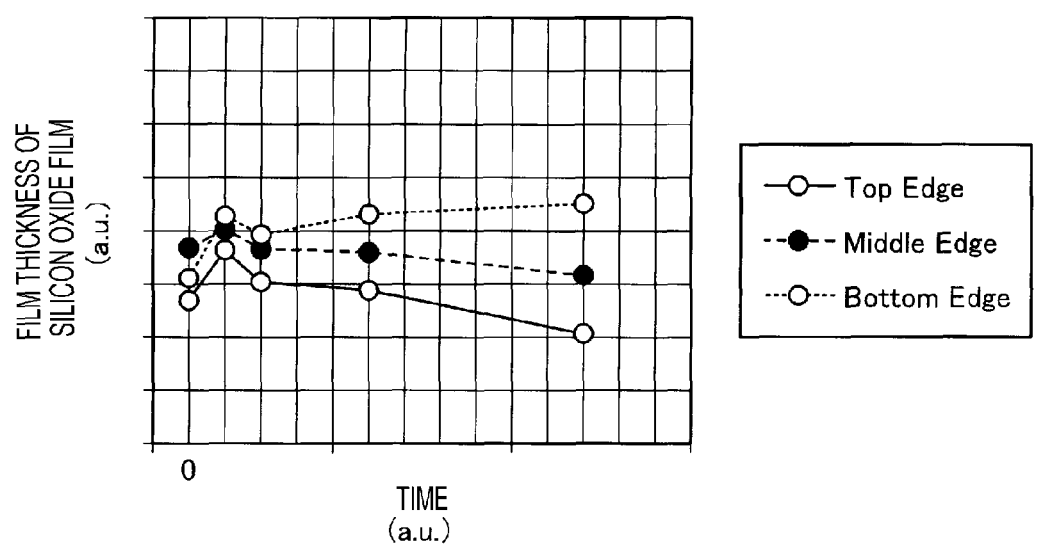
FIG. 6 is a view illustrating an example of a transition of a film thickness of the silicon oxide film in a case where the silicon concentration in the etching liquid is a second concentration.

FIG. 6 is a view illustrating an example of a transition of a film thickness of the silicon oxide film 8B in a case where the silicon concentration in the etching liquid is the second concentration Cb. From the result, when the etching processing is performed at the second concentration Cb having a relatively high silicon concentration, a phenomenon is seen in which silicon oxide is surely extracted on the silicon oxide film 8B in the initial stage, and the film thickness of the silicon oxide film 8B increases.

Meanwhile, after the initial stage of the etching processing, it is clarified that the phenomenon of the increase in the film thickness of the silicon oxide film 8B is resolved even at the second concentration Cb having a relatively high silicon concentration. That is, it is clarified that the phenomenon in which the silicon oxide is extracted on the silicon oxide film 8B is resolved after the initial stage of the etching processing.

The result is considered because the following phenomenon occurs in the substrate 8. In the initial stage of the etching processing, since the etching amount of the silicon nitride film 8A with respect to the volume of the groove 8C is large, the silicon concentration of the inside of the groove 8C (particularly, the lower side of the groove 8C) is likely to increase. Therefore, the phenomenon in which the silicon oxide is extracted on the silicon oxide film 8B occurs in the initial stage of the etching processing.

Meanwhile, after the initial stage of the etching processing, the volume of the groove 8C increases as the gap 8D is formed, while the etching amount of the silicon nitride film 8A is not much different from that of the initial stage. Therefore, the silicon concentration of the inside of the groove 8C is relatively decreased. Therefore, it is considered that the phenomenon in which the silicon oxide is extracted on the silicon oxide film 8B is resolved after the initial stage of the etching processing.

Based on the result of FIG. 6, in the embodiment, as illustrated in FIG. 4, the first etching processing which is the initial stage of the etching processing is performed at the first concentration Ca having relatively low silicon concentration. Therefore, the phenomenon in which the silicon oxide is extracted on the silicon oxide film 8B may be suppressed in the initial stage of the etching processing.

Then, after the initial stage of the etching processing, the second etching processing, performed in a stage in which the phenomenon in which the silicon oxide is extracted on the silicon oxide film 8B is resolved, is performed at the second concentration Cb having a relatively high silicon concentration. Therefore, since the selection ratio of the silicon nitride film 8A with respect to the silicon oxide film 8B may be large, the etching processing may be performed more efficiently.

In the embodiment, although the second etching processing is performed at the second concentration Cb having the relatively high silicon concentration, as illustrated in FIG. 6, the phenomenon in which the silicon oxide is extracted on the silicon oxide film 8B is resolved. Therefore, according to the embodiment, it is possible to suppress the phenomenon in which the gap between the adjacent silicon oxide films 8B is blocked by the silicon oxide.

In the embodiment, the gaps 8D on both sides are communicated with each other by the second etching processing, and the third etching processing is started after removing the silicon nitride film 8A from the substrate 8. Here, by performing the third etching processing at the third concentration Cc having a much higher silicon concentration, as illustrated in FIG. 5, it is possible to etch only the silicon oxide extracted on the silicon oxide film 8B.

That is, in the embodiment, by performing the third etching processing after removing the silicon nitride film 8A from the substrate 8, the silicon oxide extracted on the silicon oxide film 8B may be removed. Therefore, according to the embodiment, the gap 8D having a desired interval may be formed on the substrate 8.

In the embodiment, although the example in which the phosphoric acid processing liquid having the silicon concentration of the third concentration Cc is used as the processing for removing the silicon oxide extracted on the silicon oxide film 8B, the processing for removing the silicon oxide is not limited to this example. For example, the silicon oxide extracted on the silicon oxide film 8B may be removed by using SC-1 as an etching liquid.

Further, as illustrated in FIG. 4, it is desirable to increase the temperature of the etching liquid as the silicon concentration in the etching liquid increases in the first etching processing to the third etching processing. By increasing the temperature of the etching liquid in this manner, since the saturation concentration of the silicon with respect to the etching liquid may be increased, the silicon concentration in the etching liquid may be set to the second concentration Cb or the third concentration Cc as desired.

Figure 7A:
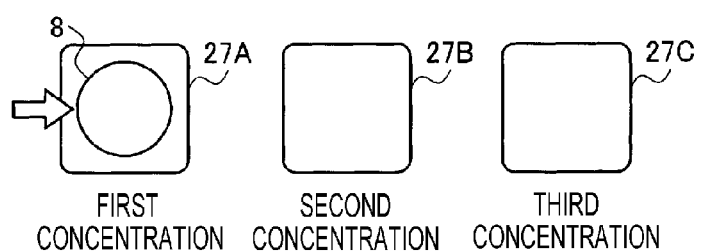
FIGS. 7A to 7C are views for explaining the etching processing of the substrate processing apparatus according to the embodiment.
Figure 7B:
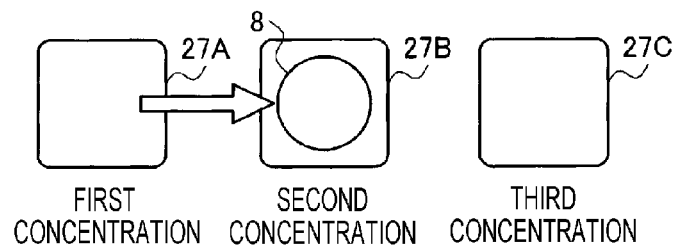
Figure 7C:
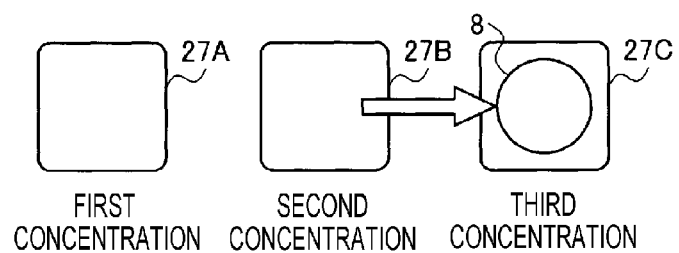

FIGS. 7A to 7C are views for explaining the etching processing of the substrate processing apparatus 1 according to the embodiment. As illustrated in FIG. 7A, in the embodiment, the substrate processing apparatus 1 is provided with three processing baths 27A, 27B, and 27C.

A phosphoric acid processing liquid having a silicon concentration of the first concentration Ca is stored in the processing bath 27A, a phosphoric acid processing liquid having a silicon concentration of the second concentration Cb is stored in the processing bath 27B, and a phosphoric acid processing liquid having a silicon concentration of the third concentration Cc is stored in the processing bath 27C.

Then, as illustrated in FIG. 7A, the controller 100 causes the substrate 8 to be transferred to the processing bath 27A, and to perform the first etching processing on the substrate 8 in the processing bath 27A. Next, as illustrated in FIG. 7B, the controller 100 causes the substrate 8 to be transferred from the processing bath 27A to the processing bath 27B, and to perform the second etching processing on the substrate 8 in the processing bath 27B.

Finally, as illustrated in FIG. 7C, the controller 100 causes the substrate 8 to be transferred from the processing bath 27B to the processing bath 27C, and to perform the third etching processing on the substrate 8 in the processing bath 27C. Therefore, the first etching processing to the third etching processing according to the embodiment may be smoothly performed on the substrate 8.

In the embodiment, although the example in which the three processing baths 27A to 27C having different silicon concentrations are provided to perform the first etching processing to the third etching processing on the substrate 8 is illustrated, the processing for performing the first etching processing to the third etching processing on the substrate 8 is not limited to this example.

For example, in one processing bath 27, first, the silicon concentration may be set to the first concentration Ca, and then the silicon concentration may be changed to the second concentration Cb at the time t1, and also, the silicon concentration may be changed to the third concentration Cc at the time t2.

<Modification>

Figure 8:
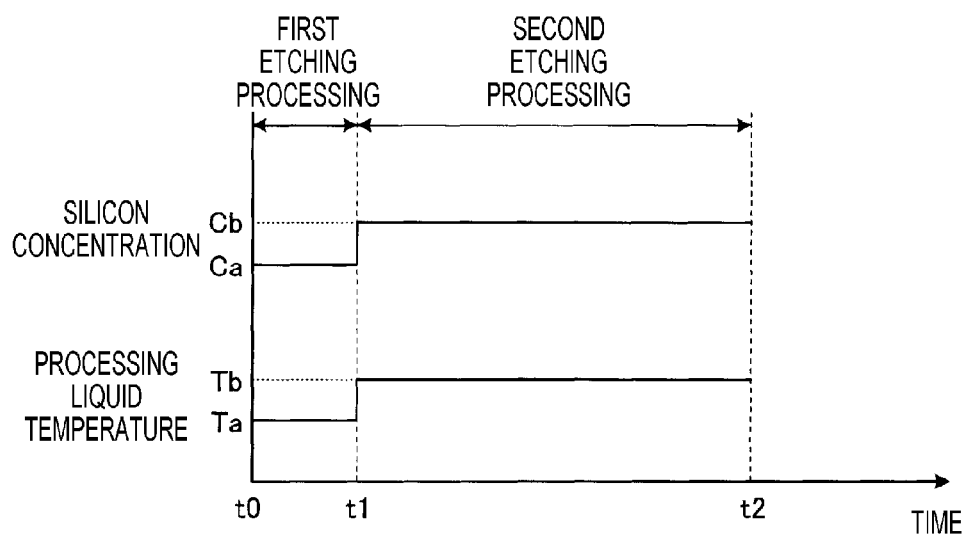
FIG. 8 is a view illustrating transitions of a silicon concentration in an etching liquid and a temperature of the etching liquid in an etching processing according to a first modification of the embodiment.

Next, descriptions will be made on various modifications of the embodiment with reference to FIG. 8 to FIGS. 14A to 14F. FIG. 8 is a view illustrating transitions of a silicon concentration in an etching liquid and a temperature of the etching liquid in an etching processing according to a first modification of the embodiment. As illustrated in FIG. 8, the etching processing performed on the substrate 8 may perform only the first etching processing and the second etching processing described above, and the third etching processing may be omitted.

Figure 9:
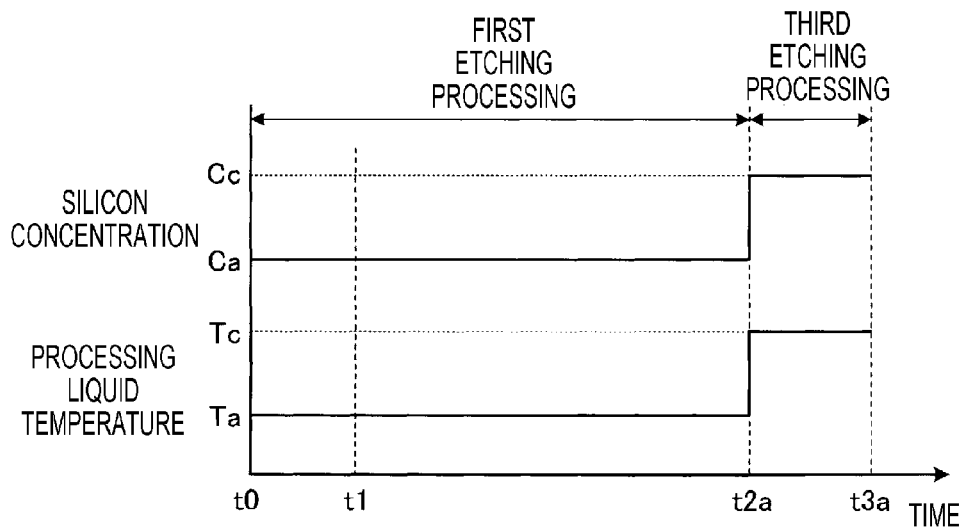
FIG. 9 is a view illustrating transitions of a silicon concentration in an etching liquid and a temperature of the etching liquid in an etching processing according to a second modification of the embodiment.

FIG. 9 is a view illustrating transitions of a silicon concentration in an etching liquid and a temperature of the etching liquid in an etching processing according to a second modification of the embodiment. As illustrated in FIG. 9, the etching processing performed on the substrate 8 may continue the first etching processing even after the time t1 elapses, and may be shifted from the first etching processing to the third etching processing at a predetermined time t2a, without performing the second etching processing thereafter.

Figure 10:
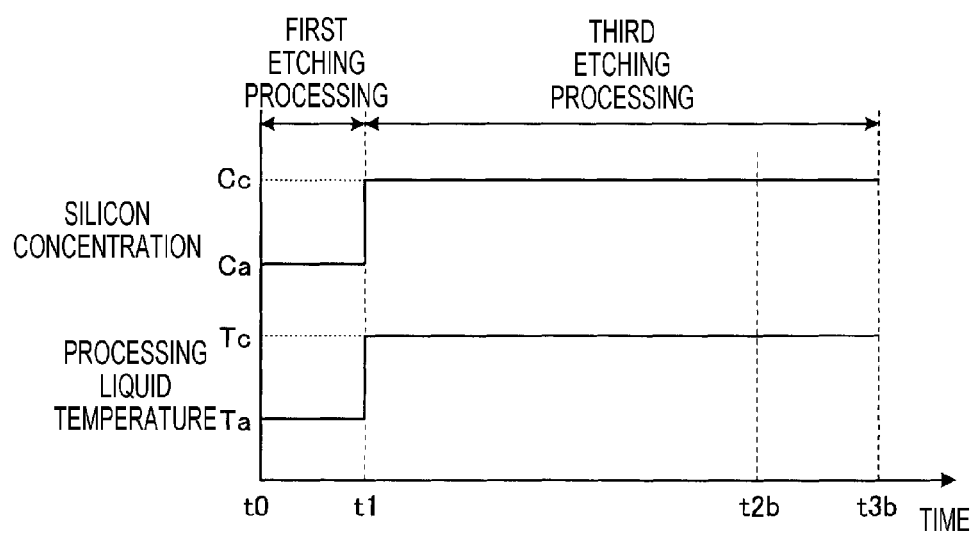
FIG. 10 is a view illustrating transitions of a silicon concentration in an etching liquid and a temperature of the etching liquid in an etching processing according to a third modification of the embodiment.

FIG. 10 is a view illustrating transitions of a silicon concentration in an etching liquid and a temperature of the etching liquid in an etching processing according to a third modification of the embodiment. As illustrated in FIG. 10, the etching processing performed on the substrate 8 may directly shifted from the first etching processing to the third etching processing after the time t1 elapses, and may directly perform the third etching processing on the substrate 8 to complete the etching processing.

Figure 11:
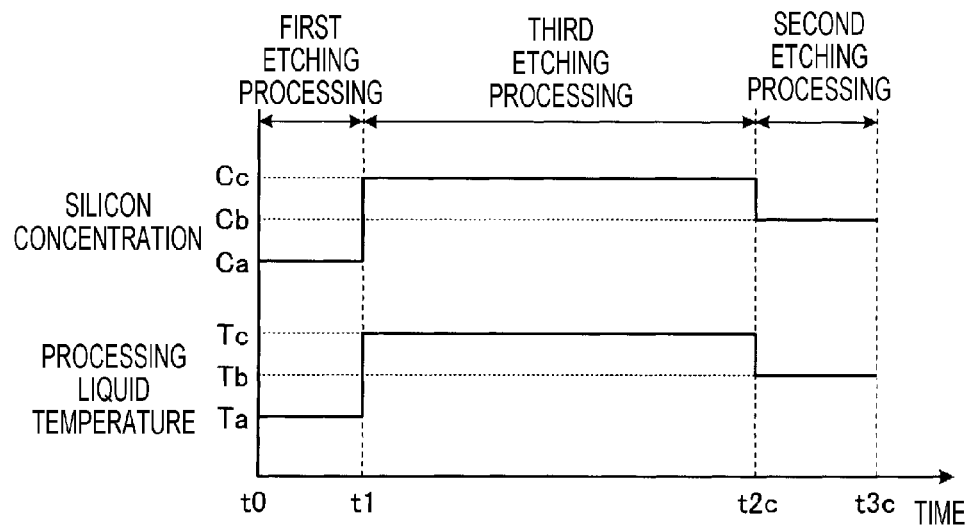
FIG. 11 is a view illustrating transitions of a silicon concentration in an etching liquid and a temperature of the etching liquid in an etching processing according to a fourth modification of the embodiment.

FIG. 11 is a view illustrating transitions of a silicon concentration in an etching liquid and a temperature of the etching liquid in an etching processing according to a fourth modification of the embodiment. As illustrated in FIG. 11, the etching processing performed on the substrate 8 may directly shifted from the first etching processing to the third etching processing after the time t1 elapses, and then may be shifted from the third etching processing to the second etching processing.

Figure 12A:
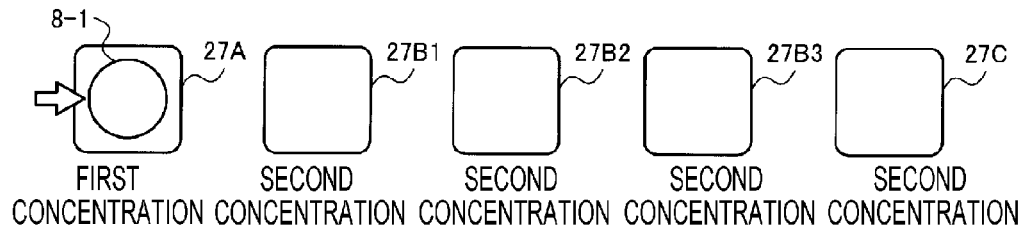
FIGS. 12A to 12F are views for explaining an etching processing of the substrate processing apparatus according to a fifth modification of the embodiment.

FIGS. 12A to 12F are views for explaining an etching processing of the substrate processing apparatus 1 according to a fifth modification of the embodiment. As illustrated in FIG. 12A, in the fifth modification, the substrate processing apparatus 1 is provided with the more processing baths 27b than the processing baths 27A. For example, in the fifth modification, the substrate processing apparatus 1 is provided with one processing bath 27A, three processing baths 27B1 to 27B3, and one processing bath 27C.

The phosphoric acid processing liquid having a silicon concentration of the first concentration Ca is stored in the processing bath 27A, the phosphoric acid processing liquid having a silicon concentration of the second concentration Cb is stored in the processing baths 27B1 to 27B3, and the phosphoric acid processing liquid having a silicon concentration of the third concentration Cc is stored in the processing bath 27C.

Then, as illustrated in FIG. 12A, the controller 100 causes a substrate 8-1 to be transferred to the processing bath 27A, and to perform the first etching processing on the substrate 8-1 in the processing bath 27A.

Figure 12B:
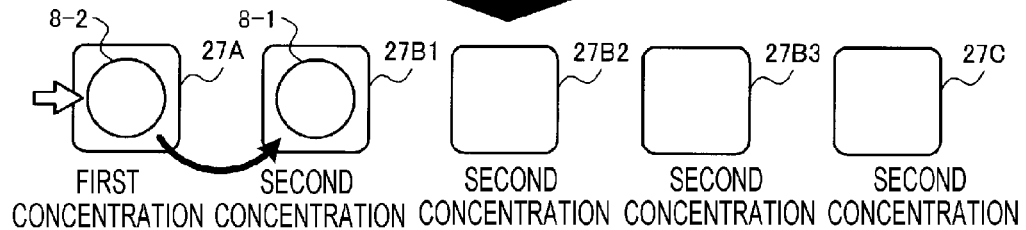

Next, as illustrated in FIG. 12B, the controller 100 causes the substrate 8-1 to be transferred from the processing bath 27A to the processing bath 27B1, and to perform the second etching processing on the substrate 8-1 in the processing bath 27B1. At this time, the controller 100 causes a substrate 8-2 of another lot to be transferred to the empty processing bath 27A, and to perform the first etching processing on the substrate 8-2 in the processing bath 27A.

Here, as illustrated in FIG. 4, the second etching processing requires a longer time (e.g., time about three or four times the first etching processing) than the first etching processing. Therefore, when the first etching processing of the substrate 8-2 which is put later is ended, the second etching processing of the substrate 8-1 which is previously put has not ended yet.

Figure 12C:
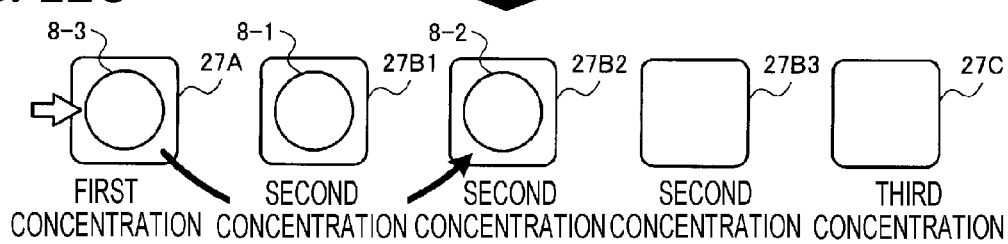

Therefore, in the fifth modification, as illustrated in FIG. 12C, the substrate 8-2 after the first etching processing is transferred to another processing bath 27B2, and the second etching processing is performed thereon. Therefore, it is possible to perform the second etching processing on the substrate 8-2 which is put later without waiting until the second etching processing on the substrate 8-1 which is previously put is ended.

Further, when the substrate 8-3 is transferred to the another processing bath 27B2, a substrate 8-3 of another lot is transferred to the empty processing bath 27A, and the first etching processing is performed on the substrate 8-3 in the processing bath 27A.

Figure 12D:
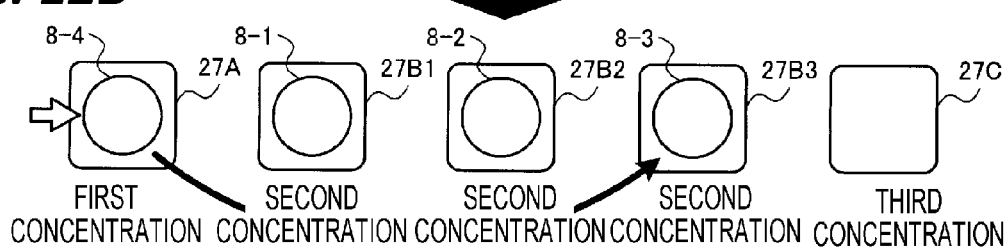

Next, as illustrated in FIG. 12D, the controller 100 causes the substrate 8-3 to be transferred from the processing bath 27A to the processing bath 27B3, and to perform the second etching processing on the substrate 8-3 in the processing bath 27B3. At this time, the controller 100 causes a substrate 8-4 of another lot to be transferred to the empty processing bath 27A, and to perform the first etching processing on the substrate 8-4 in the processing bath 27A.

Figure 12E:
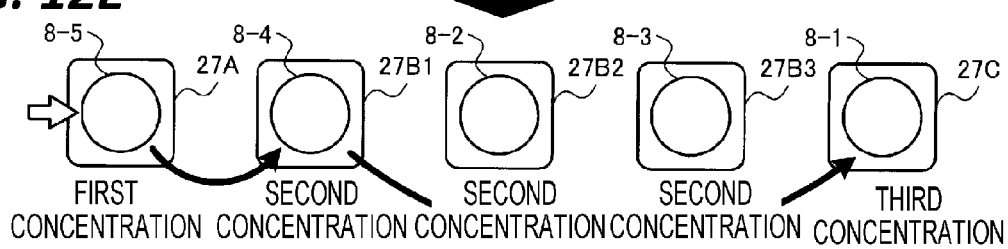

Next, as illustrated in FIG. 12E, the controller 100 causes the substrate 8-1 after the second etching processing to be transferred from the processing bath 27B1 to the processing bath 27C, and to perform the third etching processing on the substrate 8-1 in the processing bath 27C.

At this time, the controller 100 causes the substrate 8-4 after the first etching processing to be transferred from the processing bath 27A to the empty processing bath 27B1, and to perform the second etching processing on the substrate 8-4 in the processing bath 27B1. Further, the controller 100 causes a substrate 8-5 of another lot to be transferred to the empty processing bath 27A, and to perform the first etching processing on the substrate 8-5 in the processing bath 27A.

Here, as illustrated in FIG. 4, the third etching processing is ended in about the same time as the first etching processing. Therefore, the third etching processing of the substrate 8-1 which is previously put is ended at about the same timing as the second etching processing of the substrate 8-2 which is put later is ended.

Figure 12F:
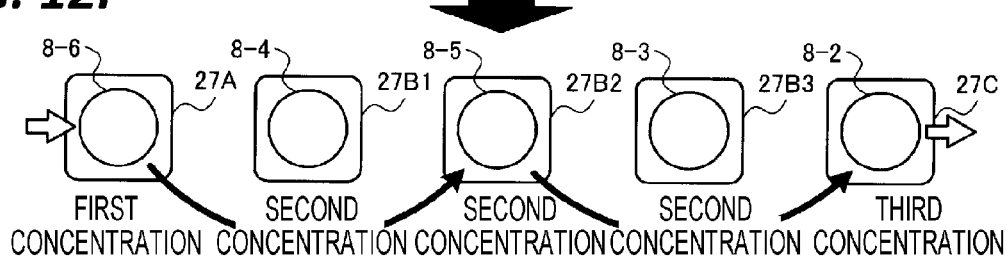

Therefore, as illustrated in FIG. 12F, when the substrate 8-1 after the third etching processing is carried-out from the processing bath 27C, the controller 100 causes the substrate 8-2 to be transferred from the processing bath 27B2 to the empty processing bath 27C, and to perform the third etching processing on the substrate 8-2 in the processing bath 27C.

At this time, the controller 100 causes the substrate 8-5 after the first etching processing to be transferred from the processing bath 27A to the empty processing bath 27B2, and to perform the second etching processing on the substrate 8-5 in the processing bath 27B2. Further, the controller 100 causes a substrate 8-6 of another lot to be transferred to the empty processing bath 27A, and to perform the first etching processing on the substrate 8-6 in the processing bath 27A.

As described so far, in the fifth modification, the processing baths 27B for performing the second etching processing which takes the longest processing time are prepared more than the processing baths 27A for performing the first etching processing or the processing baths 27C for performing the third etching processing. Therefore, the first etching processing to the third etching processing may be smoothly performed on the substrate 8 without causing the substrate 8 to wait for being processed inside the substrate processing apparatus 1.

Figure 13A:
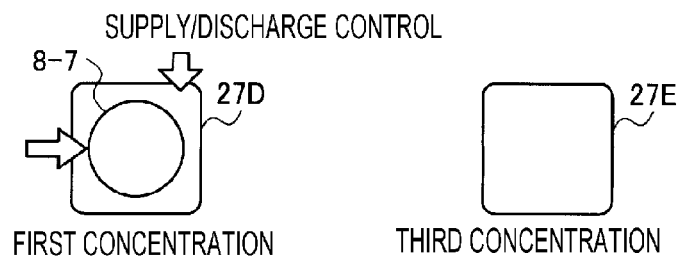
FIGS. 13A to 13E are views for explaining an etching processing of the substrate processing apparatus according to a sixth modification of the embodiment.

FIGS. 13A to 13E are views for explaining an etching processing of the substrate processing apparatus 1 according to a sixth modification of the embodiment. As illustrated in FIG. 13A, in the sixth modification, the substrate processing apparatus 1 is provided with two processing baths 27D and 27E.

The phosphoric acid processing liquid having a silicon concentration of the first concentration Ca is stored in the processing bath 27D, and the phosphoric acid processing liquid having a silicon concentration of the third concentration Cc is stored in the processing bath 27E.

Then, as illustrated in FIG. 13A, the controller 100 causes a substrate 8-7 to be transferred to the processing bath 27D, and to perform the first etching processing and the second etching processing on the substrate 8-7 in the processing bath 27D. Specifically, a supply/discharge control for controlling the silicon concentration in the etching liquid to the first concentration Ca is performed until the time t1 in the processing bath 27D.

Then, after the time t1, the controller 100 does not perform such supply/discharge control, so that the silicon concentration in the etching liquid is gradually increased to the second concentration Cb. Therefore, it is possible to shift from the first etching processing to the second etching processing in the processing bath 27D.

Figure 13B:
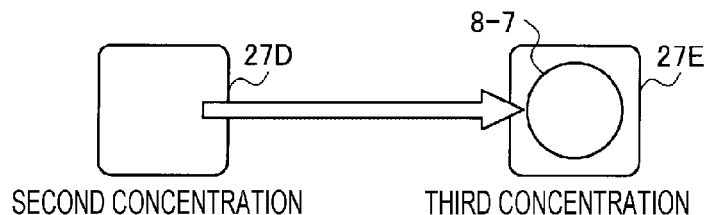

Next, as illustrated in FIG. 13B, the controller 100 causes the substrate 8-7 to be transferred from the processing bath 27D to the processing bath 27E, and to perform the third etching processing on the substrate 8-7 in the processing bath 27E. Therefore, the etching processing on the substrate 8-7 of one lot is completed.

In the third etching processing, since the silicon nitride film 8A is already removed from the substrate 8-7, the silicon concentration in the processing bath 27E is not changed from the third concentration Cc.

Figure 13C:
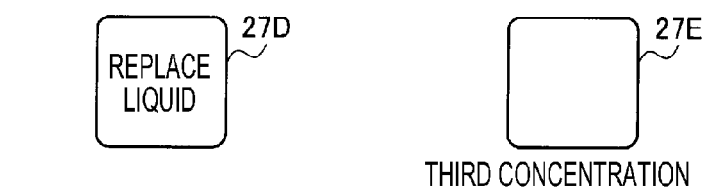
Figure 13D:
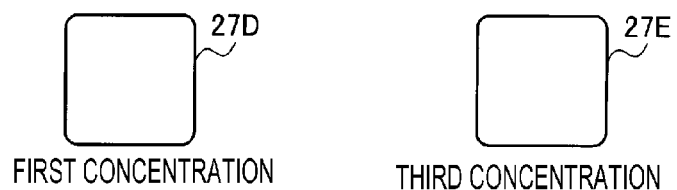

Next, as illustrated in FIG. 13C, the controller 100 causes the etching liquid in the processing bath 27D to be replaced, and as illustrated in FIG. 13D, the phosphoric acid processing liquid having the silicon concentration of the first concentration Ca is stored in the processing bath 27D.

Figure 13E:
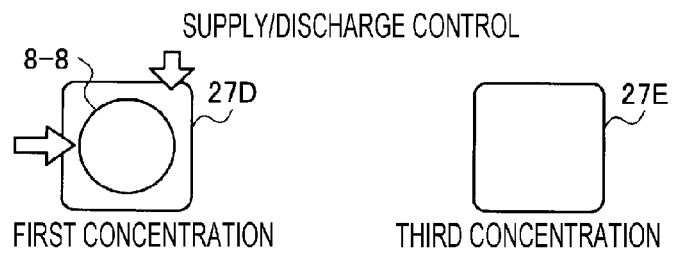

Then, as illustrated in FIG. 13E, the controller 100 causes a substrate 8-8 of the next lot to be transferred to the processing bath 27D, and to perform the first etching processing and the second etching processing on the substrate 8-8 in the processing bath 27D. Such the first etching processing and the second etching processing are the same as the processing illustrated in FIG. 13A.

Then, as illustrated in FIG. 13B, the controller 100 causes the substrate 8-8 of the next lot to be transferred from the processing bath 27D to the processing bath 27E, and to perform the third etching processing on the substrate 8-8 in the processing bath 27E. Therefore, the etching processing on the substrate 8-8 of the next lot is completed.

In this manner, by performing the first etching processing and the second etching processing in one processing bath 27D, and performing the third etching processing in the other processing bath 27E, it is possible to perform the first etching processing to the third etching processing on the substrate 8 in the two processing baths 27D and 27E.

Figure 14A:
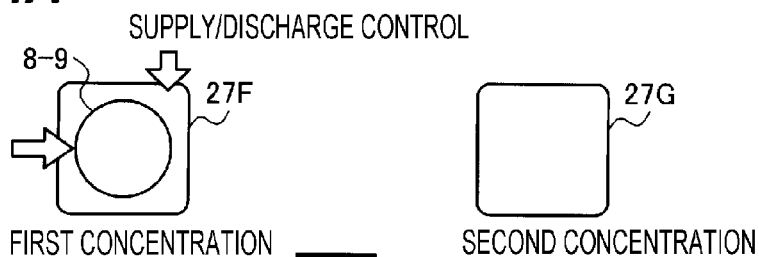
FIGS. 14A to 14F are views for explaining an etching processing of the substrate processing apparatus according to a seventh modification of the embodiment.

FIGS. 14A to 14F are views for explaining an etching processing of the substrate processing apparatus 1 according to a seventh modification of the embodiment. As illustrated in FIG. 14A, in the seventh modification, the substrate processing apparatus 1 is provided with two processing baths 27F and 27G.

The phosphoric acid processing liquid having a silicon concentration of the first concentration Ca is stored in the processing bath 27F, and the phosphoric acid processing liquid having a silicon concentration of the second concentration Cb is stored in the processing bath 27G.

Then, as illustrated in FIG. 14A, the controller 100 causes a substrate 8-9 to be transferred to the processing bath 27F, and to perform the first etching processing on the substrate 8-9 in the processing bath 27F. Specifically, a supply/discharge control for controlling the silicon concentration in the etching liquid to the first concentration Ca is performed until the time t1 in the processing bath 27F.

Figure 14B:
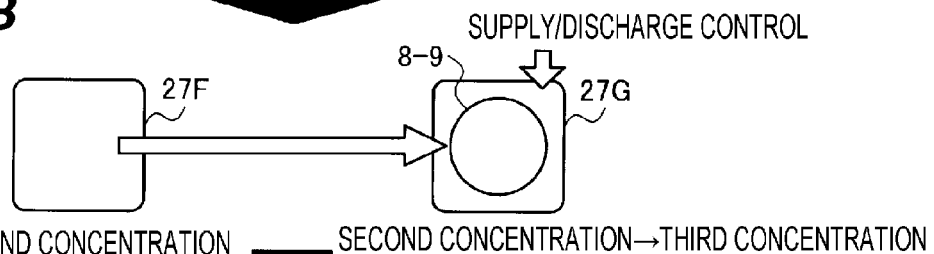

Then, as illustrated in FIG. 14B, the controller 100 stops such supply/discharge control after the time t1, and increases the silicon concentration in the etching liquid to the second concentration Cb, and then causes the substrate 8-9 to be transferred from the processing bath 27F to the processing bath 27G.

Then, the controller 100 causes the second etching processing and the third etching processing to be performed on the substrate 8-9 in the processing bath 27G Specifically, a supply/discharge control for controlling the silicon concentration in the etching liquid to the second concentration Cb is performed until the time t2 in the processing bath 27G.

Then, after the time t2, the controller 100 does not perform such supply/discharge control, so that the silicon concentration in the etching liquid is gradually increased to the third concentration Cc. Therefore, it is possible to shift from the second etching processing to the third etching processing in the processing bath 27G Then, the etching processing on the substrate 8-9 of one lot is completed.

Figure 14C:
Figure 14D:

Next, as illustrated in FIG. 14C, the controller 100 causes the etching liquid in the processing bath 27G to be replaced, and as illustrated in FIG. 14D, the phosphoric acid processing liquid having the silicon concentration of the first concentration Ca is stored in the processing bath 27G.

Figure 14E:
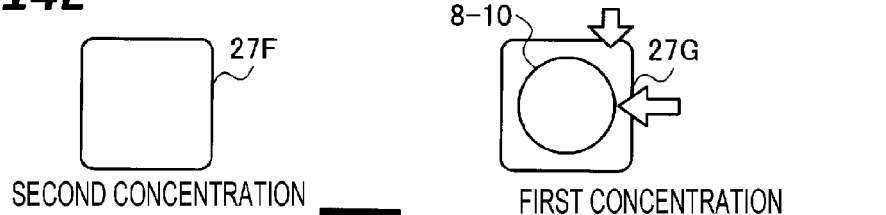

Then, as illustrated in FIG. 14E, the controller 100 causes a substrate 8-10 of the next lot to be transferred to the processing bath 27G, and to perform the first etching processing on the substrate 8-10 in the processing bath 27G Specifically, a supply/discharge control for controlling the silicon concentration in the etching liquid to the first concentration Ca is performed until the time t1 in the processing bath 27G.

Figure 14F:
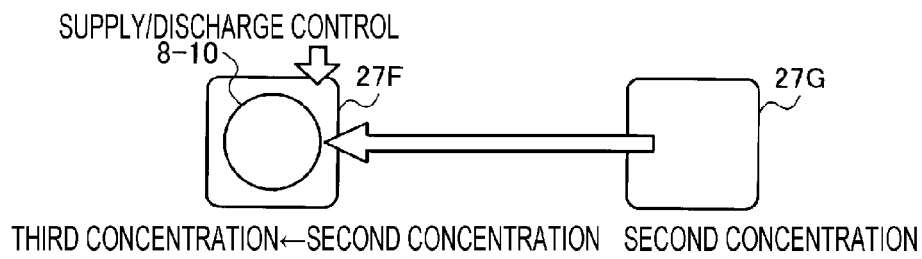

Then, as illustrated in FIG. 14F, the controller 100 stops such supply/discharge control after the time t1, and increases the silicon concentration in the etching liquid to the second concentration Cb, and then causes the substrate 8-10 of the next lot to be transferred from the processing bath 27G to the processing bath 27F.

Then, the controller 100 causes the second etching processing and the third etching processing to be performed on the substrate 8-10 of the next lot in the processing bath 27F. Specifically, a supply/discharge control for controlling the silicon concentration in the etching liquid to the second concentration Cb is performed until the time t2 in the processing bath 27G.

Then, after the time t2, the controller 100 does not perform such supply/discharge control, so that the silicon concentration in the etching liquid is gradually increased to the third concentration Cc. Therefore, it is possible to shift from the second etching processing to the third etching processing in the processing bath 27F. Then, the etching processing on the substrate 8-10 of the next lot is completed.

Next, although not illustrated, the controller 100 causes the etching liquid in the processing bath 27F to be replaced to store the phosphoric acid processing liquid having the silicon concentration of the first concentration Ca in the processing bath 27G, and to return the state illustrated in FIG. 14A.

In this manner, by alternately performing the first etching processing, the second etching processing, and the third etching processing in two processing baths 27F and 27G, it is possible to perform the first etching processing to the third etching processing on the substrate 8 in the two processing baths 27F and 27G.

The substrate processing apparatus 1 according to the embodiment includes a substrate processing bath (processing bath 27A) in which the etching processing is performed by immersing the substrate 8 on which a silicon oxide film and a silicon nitride film are formed in a phosphoric acid processing liquid, and the controller 100 which controls the substrate processing bath (processing bath 27A). Then, the controller 100 controls the silicon concentration in the phosphoric acid processing liquid to the first silicon concentration (first concentration Ca) at which the silicon oxide film 8B is etched from the time at which the substrate 8 is started to immerse in the substrate processing bath (processing bath 27A) until the first time interval elapses. Therefore, even in the substrate 8 on which the silicon nitride film 8A and the silicon oxide film 8B are highly laminated, the silicon nitride film 8A may be etched with a good accuracy.

Further, the substrate processing apparatus 1 according to the embodiment includes another substrate processing bath (processing bath 27B) in which the etching processing is performed, and the transfer unit (lot transfer mechanism 19) which transfers the substrate 8 between the substrate processing bath (processing bath 27A) and the another substrate processing bath (processing bath 27B). Further, the controller 100 controls the silicon concentration in the phosphoric acid processing liquid stored in the another substrate processing bath (processing bath 27B) to the second silicon concentration (second concentration Cb) higher than the first silicon concentration (first concentration Ca). Then, the controller 100 causes the substrate 8 immersed in the substrate processing bath (processing bath 27A) until the first time interval has elapsed to be transferred to the another substrate processing bath (processing bath 27B) to immerse. Therefore, the first etching processing to the third etching processing according to the embodiment may be smoothly performed on the substrate 8.

Further, in the substrate processing apparatus 1 according to the embodiment, the number of the another substrate processing baths (processing baths 27B) is set to be larger than the number of the substrate processing baths (processing baths 27A). Therefore, the first etching processing to the third etching processing may be smoothly performed on the substrate 8 without causing the substrate 8 to wait for being processed inside the substrate processing apparatus 1.

<Details of Etching Processing>

Figure 15:
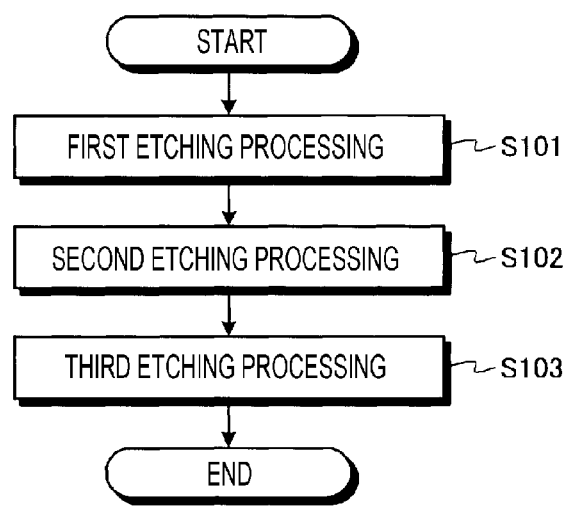
FIG. 15 is a flowchart illustrating a processing order of the etching processing according to the embodiment.

Next, descriptions will be made on the details of the etching processing performed by the substrate processing apparatus 1 according to the embodiment. FIG. 15 is a flowchart illustrating a processing order of the etching processing according to the embodiment.

First, the controller 100 causes to perform the first etching processing on the substrate 8 at the first time interval which is from the time t0 at which the etching processing is started to the predetermined time t1 (step S101). In the first etching processing, the controller 100 controls the silicon concentration in the etching liquid to the predetermined first concentration Ca, and the temperature of the etching liquid to the predetermined first temperature Ta.

Next, the controller 100 causes to perform the second etching processing on the substrate 8 at the second time interval which is from the time t1 to the predetermined time t2 (step S102). In the second etching processing, the controller 100 controls the silicon concentration in the etching liquid to the predetermined second concentration Cb, and the temperature of the etching liquid to the predetermined second temperature Tb.

Finally, the controller 100 causes to perform the third etching processing on the substrate 8 at the third time interval which is from the time t2 to the predetermined time t3 (step S103). In the third etching processing, the controller 100 controls the silicon concentration in the etching liquid to the predetermined third concentration Cc, and the temperature of the etching liquid to the predetermined third temperature Tc.

A substrate processing method according to the embodiment includes an etching process in which the substrate 8 on which the silicon oxide film 8B and the silicon nitride film 8A are formed is etched with the phosphoric acid processing liquid. Then, in the etching process, the silicon concentration in the phosphoric acid processing liquid is set to the first silicon concentration (first concentration Ca) at which the silicon oxide film 8B is etched, from the start time (time t0) until the first time interval has elapsed (until time t1). Therefore, even in the substrate 8 on which the silicon nitride film 8A and the silicon oxide film 8B are highly laminated, the silicon nitride film 8A may be etched with a good accuracy.

Further, in the substrate processing method according to the embodiment, in the etching process, the silicon concentration in the phosphoric acid processing liquid is set to the second silicon concentration (second concentration Cb) higher than the first silicon concentration (first concentration Ca) from the time (time t1) at which the first time interval elapses. Therefore, since the selection ratio of the silicon nitride film 8A with respect to the silicon oxide film 8B may be large, the etching processing may be performed more efficiently.

Further, in the substrate processing method according to the embodiment, in the etching process, the silicon concentration in the phosphoric acid processing liquid is set to the third silicon concentration (third concentration Cc) higher than the second silicon concentration (second concentration Cb), after the first time interval, and also from the time (time t2) at which the second time interval elapses. Therefore, the silicon oxide extracted on the silicon oxide film 8B may be removed.

Further, in the substrate processing method according to the embodiment, the third silicon concentration (third concentration Cc) is a concentration at which the silicon oxide film 8B is not etched. Therefore, only the silicon oxide extracted on the silicon oxide film 8B may be removed.

Further, in the substrate processing method according to the embodiment, in the etching process, the temperature of the phosphoric acid processing liquid is set to the second temperature (second temperature Tb) higher than the first temperature (first temperature Ta) which is until the first time interval has elapsed (until time t1), from the time (time t1) at which the first time interval elapses. Therefore, since the saturation concentration of the silicon with respect to the etching liquid may be increased, the silicon concentration in the etching liquid may be set to the second concentration Cb as desired.

Further, in the substrate processing method according to the embodiment, in the etching process, the temperature of the phosphoric acid processing liquid is set to the third temperature (third temperature Tc) higher than the second temperature (second temperature Tb), after the first time interval, and also from the time (time t2) at which the second time interval elapses. Therefore, since the saturation concentration of the silicon with respect to the etching liquid may be increased, the silicon concentration in the etching liquid may be set to the third concentration Cc as desired.

In the above, although the exemplary embodiment of the present disclosure has been described, the present disclosure is not limited to the above embodiment, and various modifications may be made without departing from the gist of the present disclosure. For example, in the above embodiment, the example is described in which a solution in which a silicon-containing compound is added to a phosphoric acid liquid solution to regulate a silicon concentration is used as an etching liquid. However, an $SiO_2$ extraction inhibiting agent or the like may be added to the etching liquid.

According to the present disclosure, even in a case of a substrate on which a silicon nitride film and a silicon oxide film are highly laminated, it is possible to etch the silicon nitride film with a good accuracy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a first substrate processing bath in which a first etching processing is performed by immersing a substrate having thereon a laminated film of a silicon oxide film and a silicon nitride film in a phosphoric acid processing liquid;
    a second substrate processing bath in which a second etching processing is performed;
    a transfer arm configured to transfer the substrate between the first substrate processing bath and the second substrate processing bath; and
    a controller configured to control an overall operation of the substrate processing apparatus,
    wherein the controller is programmed to:
    first maintain a silicon concentration in the phosphoric acid processing liquid stored in the first substrate processing bath at a first silicon concentration at which the silicon oxide film is etched, from a time at which the immersion of the substrate in the first substrate processing bath is started until a first time interval elapses,
    second maintain the silicon concentration in the phosphoric acid processing liquid stored in the second substrate processing bath at a second silicon concentration higher than the first silicon concentration at which silicon oxide is extracted on the silicon oxide film, and
    first transfer the substrate which is immersed in the first substrate processing bath when the first time interval elapses to be transferred to and immersed in the second substrate processing bath using the transfer arm.

2. The substrate processing apparatus according to the claim 1, wherein the number of second substrate processing baths is larger than the number of first substrate processing baths.

3. The substrate processing apparatus according to the claim 1, further comprising:
    a third substrate processing bath in which a third etching process is performed,
    wherein the controller is further programmed to:
    third maintain a silicon concentration in the phosphoric acid processing liquid stored in the third processing bath at a third silicon concentration higher than the second silicon concentration at which the silicon oxide film is not etched and the silicon nitride is removed,
    second transfer the substrate which is immersed in the second substrate processing bath to be transferred to and immersed in the third substrate processing bath.

4. The substrate processing apparatus according to the claim 3, wherein the controller is further programmed to perform the second transfer after an end of the first time interval, and also from a time at which a second time interval elapses.

5. The substrate processing apparatus according to the claim 3, wherein the controller is further programmed to, in the third maintain, set the temperature of the phosphoric acid processing liquid at a third temperature higher than the second temperature, after the end of the first time interval, and also from the time at which a second time interval elapses.

6. The substrate processing apparatus according to the claim 1, wherein the controller is further programmed to, in the second maintain, set a temperature of the phosphoric acid processing liquid at a second temperature higher than a first temperature set during the first time interval, from a time at which the first time interval elapses.

\* \* \* \* \*